STABILIZED OSCILLATOR
Filed Oct. 25, 1957
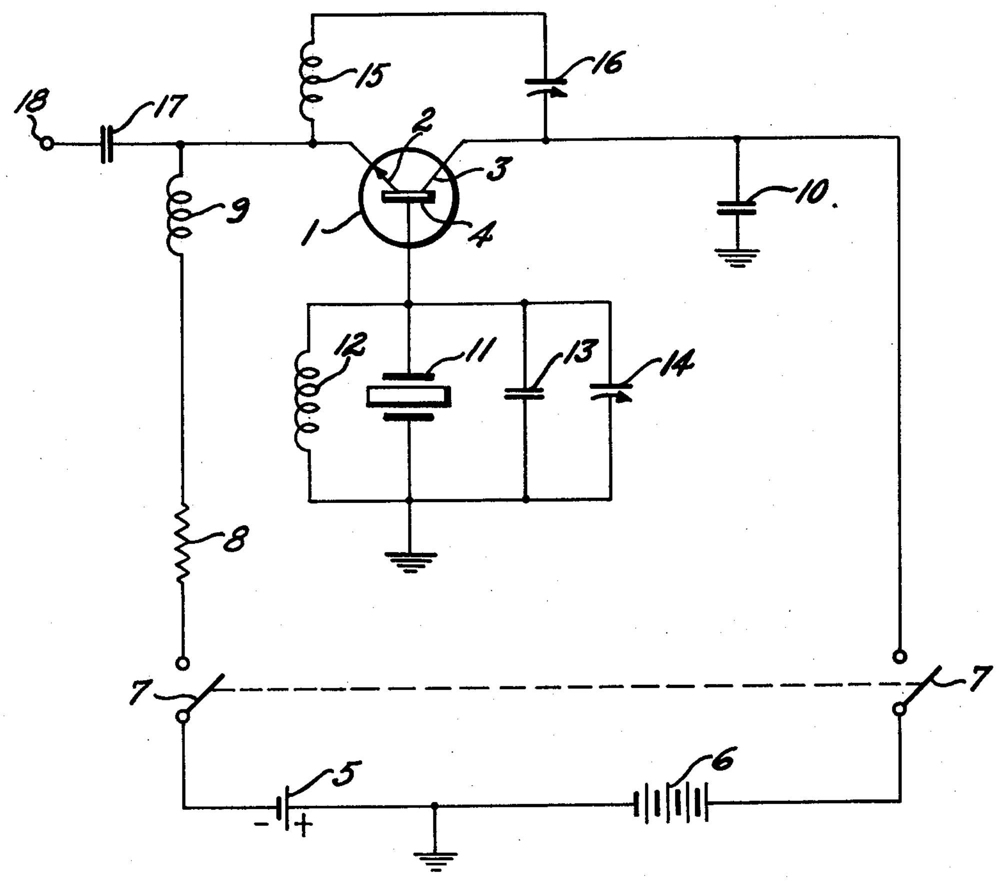
INVENTOR.
WILLIAM N. COFFEY
BY Wade Koontz
George Fine
ATTORNEYS 2,930,990
Patented Mar. 29, 1960

2,930,990

STABILIZED OSCILLATOR

William N. Coffey, Ballston Lake, N.Y., assignor to the United States of America as represented by the Secretary of the Air Force Application October 25, 1957, Serial No. 692,508

3 Claims. (Cl. 331—116)

This invention relates to oscillators and particularly to a radio frequency transistor oscillator utilizing a quartz-crystal resonator for frequency stabilization.

One of the essential elements of an oscillator is amplification. There must exist the ability of changing small variations of input power into larger variations of output power. Where amplification circuitry of this nature is present, an oscillator may be provided by utilizing a feedback path from the output to input so that the output power in correct magnitude and phase is fed back to the input, and in addition there is required a source of D.C. power.

However, although a transistor oscillator providing a sinusoidal output is available, the frequency stability of an oscillator of this class does not meet the rigid stability requirements in cases where the oscillator is to be employed as a frequency standard. It is necessary that the oscillator be capable of short and long time frequency stability of a high order. By providing a novel transistor oscillator circuit utilizing a quartz-crystal as the frequency determining element, a frequency standard of a high order of stability is achieved.

In accordance with the present invention, a novel crystal-controlled transistor oscillator is provided. It is operated as a grounded-collector oscillator. The oscillator incorporates a transistor having at least three electrodes, namely, an emitter, collector and base, and the oscillator utilizes an adjustable external feedback path from the output to the input. The frequency determining element, namely a quartz-crystal, is connected in the base circuit of the oscillator and is operated in an anti-resonant state. The quartz-crystal is paralleled with a capacitance, part of which is variable to enable the crystal to be operated as an anti-resonant circuit. Variation of this capacitance will allow the anti-resonant frequency to be changed slightly.

It is an object of the present invention to provide a novel crystal-controlled transistor oscillator.

It is still another object of this invention to provide a novel crystal-controlled oscillator utilizing an adjustable external feedback path.

It is a further object of this invention to provide a novel crystal-controlled transistor oscillator of the grounded-collector type.

It is still a further object of the present invention to provide a crystal-controlled transistor oscillator to be utilized as a frequency standard.

Further objects and advantages of the present invention will appear from the more detailed description set forth below, it being understood, however, that such more detailed description is given by way of illustration and explanation only, and not by way of limitation, since various changes therein may be made by those skilled in the art without departing from the scope and spirit of the present invention.

Referring to the drawing, the single figure is a schematic circuit of the invention.

Referring specifically to the drawing, there is shown the circuit of my invention including a transistor 1 having three electrodes, emitter 2, collector 3 and base 4, of which the emitter 2 serves as the output electrode, base 4 serves as the input electrode and collector 3 as a junction point for reception of feedback current in the manner hereinafter described. The necessary D.C. operating voltages are supplied by power sources 5 and 6.

The positive side of power source 5 is connected to ground. The negative side is connected to emitter 2 through switch 7, resistor 8 and inductance 9. The negative side of power source 6 is connected to ground. The positive side is connected to collector 3 by way of switch 7.

Collector 3 is by-passed to ground by capacitor 10. Quartz crystal 11 is connected in series with base 4 to ground. Inductance 12, capacitors 13 and 14 are in parallel with crystal 11. Inductance 15 and variable capacitor 16 are connected in series and bridge electrodes 2 and 3 of transistor 1. Capacitor 17 is connected between output terminal 18 and emitter 2.

The circuit shown in the drawing is operated as a grounded-collector oscillator. Crystal 11 is paralleled with fixed capacitor 13 and variable capacitor 14 to enable crystal 11 to be operated as an anti-resonant circuit. Variation of capacitor 14 allows the anti-resonant frequency to be changed slightly. Inductance 12 across crystal 11 is utilized as an R.F. choke and provides a path for the D.C. base current. Inductance 15 and variable capacitor 16 provide a series L—C circuit between emitter 2 and collector 3 for adjusting the magnitude and phase of the feedback signal necessary for the circuit to oscillate. In the operation of the oscillator, switch 17 is closed thus applying the operating potentials, thereby producing a current flow between base 4 and collector 3 by way of their common ground connection. Crystal 11 goes into the anti-resonance mode with inductance 12 providing a direct current path to ground. As crystal 11 goes into anti-resonance, an output signal is obtained from emitter 2, portion of which is fed back to collector 3 by means of inductance 15 and capacitor 16, the common ground existing between collector 3 and base 4 again being utilized to furnish a current path as between collector 3 and base 4. The output signal reaches output terminal 18 by way of small value capacitor 17 which is connected to emitter 2. Changes in the impedance level between output terminal 18 and ground produce negligible variations in the operating frequency.

The invention provides, therefore, a novel transistor oscillator frequency stabilized by quartz-crystal and having an adjustable external feedback path necessary for the circuit to oscillate. The frequency stability is thereby of such high order that the invention may be utilized as a frequency standard.

While a particular embodiment of the invention has been shown and described, modifications may be made and it is intended in the appended claims to cover all such modifications as may fall within the true spirit and scope of the invention.

What is claimed is:

1. A crystal-controlled transistor oscillator which comprises a transistor having an emitter electrode, a collector electrode, and a base electrode, means to apply a first direct current potential to said emitter by way of a resistance and an inductance and a second direct current potential directly to said collector, said potentials having a common ground, crystal means connected from said base to ground, means to produce anti-resonance in said crystal means upon the application of said first and second potentials, means to generate an output signal at said emitter as said crystal means becomes anti-resonant, adjustable series-resonant means external to said transistor to feed back a portion of the output signal from said emitter, said portion being applied to said collector in the proper phase and magnitude to facilitate oscillations, and output means for said oscillator connected to said emitter so that variations of impedance level at the output produce negligible variations in the operating frequency.

2. A crystal-controlled transistor oscillator which comprises a transistor having an emitter electrode, a collector electrode, and a base electrode, means to apply a first direct current potential to said emitter by way of a resistance and inductor and a second direct current potential directly to said collector, said first and second potential having a common ground, crystal means connected between said base and ground, means to anti-resonate said crystal means upon said application of said first and second potentials, means including a variable capacitor in parallel with said crystal means to shift the anti-resonant frequency of said crystal means, adjustable series-resonant means, external to said transistor to feed back a portion of the output signal from the emitter resulting from said anti-resonant operation of said crystal means, said portion of said output signal being applied to said collector, and output means including a capacitor for said oscillator connected to said emitter so that variations of impedance level at the output produce negligible variations in the operating frequency.

3. A crystal-controlled transistor oscillator utilized as a frequency standard which comprises a transistor having an emitter electrode, a collector electrode and a base electrode, simultaneous means to apply a first direct current potential to said emitter by way of a resistance and an inductor and a second direct current potential directly to said collector, said first and second potential having a common ground, crystal means connected between said base and ground, means to anti-resonate said crystal means upon said application of said potentials, means including a variable capacitor in parallel with said crystal means to shift the anti-resonant frequency of said crystal means, adjustable series-resonant means connected externally to said transistor to feed back to said collector a portion of the output signal at said emitter resulting from said anti-resonant operation of said crystal means, said adjustable means being comprised of an inductance and variable capacitance arranged in series and connected between said emitter electrode and collector electrode, means connected in series with said base electrode to ground to provide a direct current path for said transistor, and means including a capacitor connected to said emitter to provide an oscillator output signal whose frequency is stable regardless of variations of the output impedance level.

References Cited in the file of this patent

UNITED STATES PATENTS

| | | |
|---|---|---|
| 2,570,436 | Eberhard et al. | Oct. 9, 1951 |
| 2,675,474 | Eberhard | Apr. 13, 1954 |

OTHER REFERENCES

"Handbook of Piezoelectric Crystals for Radio Equipment Designers," by Buchanan, December 1954, page 195. Published by Office of Technical Services, U.S. Dept. of Comm., Wash., D.C., ref. PB-No. 11586.

"Transistor Theory and Practice," by Turner, Apr. 2, 1954, pages 76–81, published by Gernsback Publ. Inc., N.Y.